United States Patent
Tallavarjula et al.

(10) Patent No.: US 9,403,251 B2
(45) Date of Patent: Aug. 2, 2016

(54) MINIMAL CONTACT EDGE RING FOR RAPID THERMAL PROCESSING

(71) Applicant: APPLIED MATERIALS, INC., Santa Clara, CA (US)

(72) Inventors: Sairaju Tallavarjula, Santa Clara, CA (US); Kevin Joseph Bautista, San Jose, CA (US); Jeffrey Tobin, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 415 days.

(21) Appl. No.: 14/042,864

(22) Filed: Oct. 1, 2013

(65) Prior Publication Data
US 2014/0105582 A1 Apr. 17, 2014

Related U.S. Application Data

(60) Provisional application No. 61/714,931, filed on Oct. 17, 2012.

(51) Int. Cl.
| | |
|---|---|
| F26B 19/00 | (2006.01) |
| A45D 20/40 | (2006.01) |
| F27D 5/00 | (2006.01) |
| B23Q 3/18 | (2006.01) |
| H05B 3/00 | (2006.01) |
| H01L 21/67 | (2006.01) |
| H01L 21/687 | (2006.01) |

(52) U.S. Cl.
CPC ............ *B23Q 3/18* (2013.01); *H01L 21/67115* (2013.01); *H01L 21/6875* (2013.01); *H05B 3/0038* (2013.01); *H05B 3/0047* (2013.01)

(58) Field of Classification Search
None
See application file for complete search history.

(56) References Cited

U.S. PATENT DOCUMENTS

| | | | |
|---|---|---|---|
| 5,848,889 A | 12/1998 | Tietz et al. | |
| 6,280,183 B1 * | 8/2001 | Mayur | C23C 16/4585 432/253 |
| 6,395,363 B1 * | 5/2002 | Ballance | H01L 21/68735 118/500 |

(Continued)

FOREIGN PATENT DOCUMENTS

| | | |
|---|---|---|
| JP | 04-365317 A | 12/1992 |
| JP | 2003-059852 A | 2/2003 |
| JP | 2005-129575 A | 5/2005 |

OTHER PUBLICATIONS

International Search Report and Written Opinion mailed Jan. 16, 2014 for PCT Application No. PCT/US2013/063183.

*Primary Examiner* — Thor Campbell
(74) *Attorney, Agent, or Firm* — Moser Taboada; Alan Taboada

(57) ABSTRACT

Embodiments of edge rings for substrate supports of semiconductor substrate process chambers are provided herein. In some embodiments, an edge ring for a semiconductor process chamber may include an annular body having a central opening, an inner edge, an outer edge, an upper surface, and a lower surface, an inner lip disposed proximate the inner edge and extending downward from the upper surface, and a plurality of protrusions extending upward from the inner lip and disposed along the inner edge of the annular body, wherein the plurality of protrusions are arranged to support a substrate above the inner lip and over the central opening, wherein the inner lip is configured to substantially prevent light radiation from travelling between a first volume disposed above the edge ring and a second volume disposed below the edge ring when a substrate is disposed on the plurality of protrusions.

19 Claims, 4 Drawing Sheets

(56) References Cited

U.S. PATENT DOCUMENTS

| | | | |
|---|---|---|---|
| 7,378,618 B1 * | 5/2008 | Sorabji | C30B 31/14 118/50.1 |
| 8,221,602 B2 * | 7/2012 | Brown | C23C 14/564 118/728 |
| 8,744,250 B2 * | 6/2014 | Koelmel | F27D 11/12 118/728 |
| 2008/0170842 A1 | 7/2008 | Hunter et al. | |
| 2009/0084317 A1 * | 4/2009 | Wu | C23C 16/45563 118/728 |

* cited by examiner

MINIMAL CONTACT EDGE RING FOR RAPID THERMAL PROCESSING

CROSS-REFERENCE TO RELATED APPLICATIONS

This application claims benefit of U.S. provisional patent application Ser. No. 61/714,931, filed Oct. 17, 2012, which is herein incorporated by reference.

FIELD

Embodiments of the present invention generally relate to semiconductor processing.

BACKGROUND

Conventional semiconductor process chambers, for example, such as Rapid Thermal Processing (RTP) chambers, typically utilize a substrate support having one or more rings (e.g. an edge ring) disposed atop the substrate support and configured to secure the substrate in a desired position during processing. However, the inventors have observed that conventionally used edge rings may have different thermal properties (e.g. different heating and cooling rates) as compared to the substrate support, thereby causing temperature non-uniformities proximate the edge of the substrate, thus causing an undesirable non-uniform processing of the substrate. In addition, the edge ring may be heated to a higher temperature than the substrate support during processing due to the configuration of the process chamber, thereby leading to further temperature non-uniformities which can cause thermal stress, substrate warpage, defects, dislocations, litho-overlay errors, and slip.

Thus, the inventors have provided an improved apparatus for processing a substrate.

SUMMARY

Embodiments of edge rings for substrate supports of semiconductor substrate process chambers are provided herein. In some embodiments, an edge ring for a semiconductor process chamber may include an annular body having a central opening, an inner edge, an outer edge, an upper surface, and a lower surface, an inner lip disposed proximate the inner edge and extending downward from the upper surface, and a plurality of protrusions extending upward from the inner lip and disposed along the inner edge of the annular body, wherein the plurality of protrusions are arranged to support a substrate above the inner lip and over the central opening, wherein the inner lip is configured to substantially prevent light radiation from travelling between a first volume disposed above the edge ring and a second volume disposed below the edge ring when a substrate is disposed on the plurality of protrusions.

In some embodiments, an apparatus includes a processing chamber having a substrate support including an edge ring to support a substrate proximate a peripheral edge of the substrate, a base disposed below the edge ring, and one or more members extending from the base to support the edge ring above the base, a lamphead disposed above the substrate support to provide energy to a top surface of a substrate when disposed on the substrate support, and at least one temperature sensor opposing the lamphead and disposed below the edge ring to measure heat energy radiated from a backside of the substrate when disposed on the substrate support, wherein the edge ring includes an annular body having a central opening, an inner edge, an outer edge, an upper surface, and a lower surface, an inner lip disposed proximate the inner edge and extending downward from the upper surface, and a plurality of protrusions extending upward from the inner lip and disposed along the inner edge of the annular body, wherein the plurality of protrusions are arranged to support a substrate above the inner lip and over the central opening, wherein the inner lip is configured to substantially prevent light radiation from travelling between a first volume disposed above the edge ring and a second volume disposed below the edge ring when a substrate is disposed on the plurality of protrusions.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
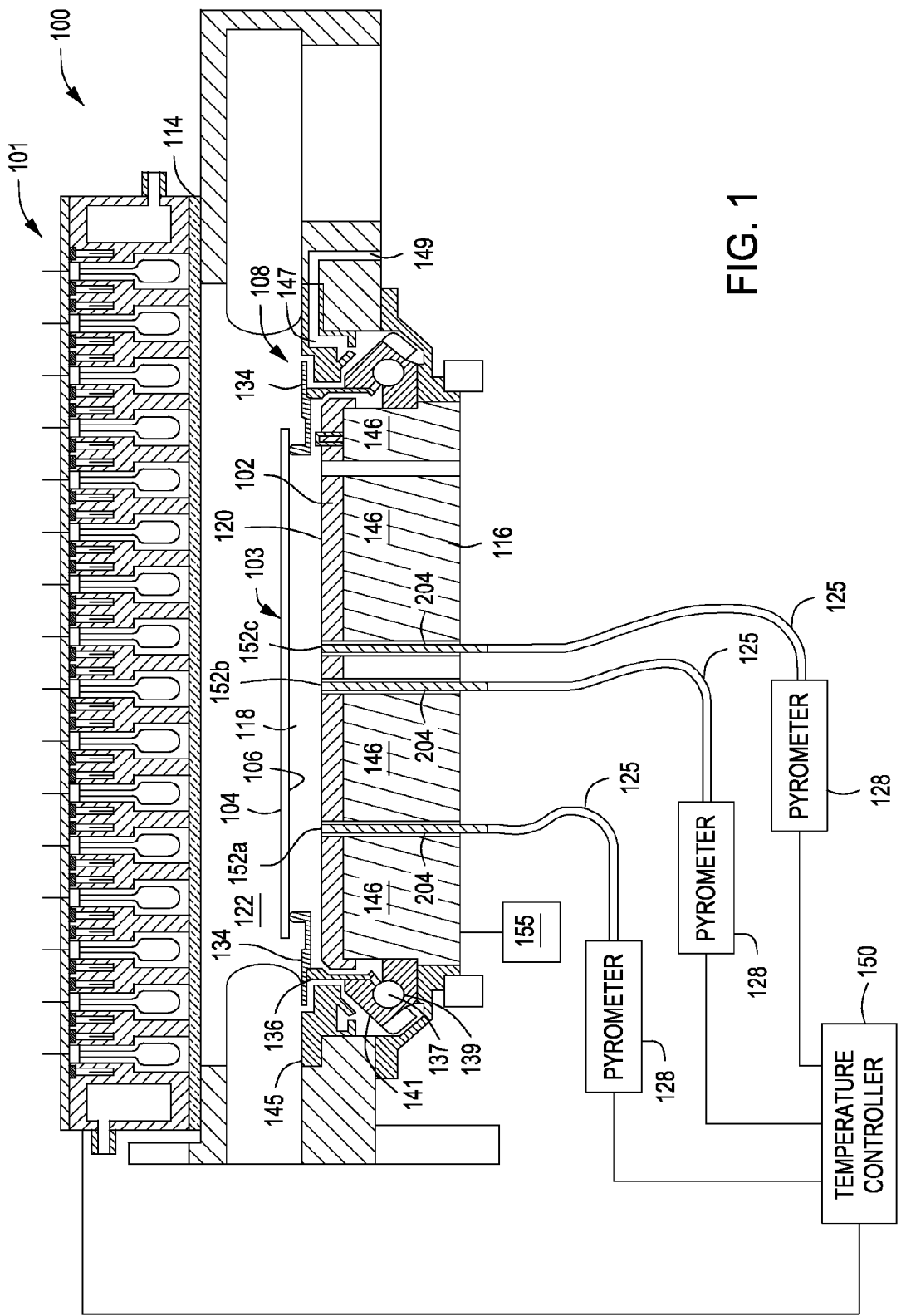
FIG. 1 depicts a process chamber suitable for use with a minimal contact edge ring in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments consistent with the present invention provide an edge ring to support a substrate in a substrate processing chamber, such as a Rapid Thermal Processing (RTP) chamber, for example. The edge ring may support the substrate proximate a peripheral edge of the substrate at multiple contact points (e.g., protrusions along the inner edge of the edge ring). The protrusions are configured to support the substrate with minimal contact area and minimal heat transfer between the edge ring and the substrate. The upper surfaces of the edge ring can be coated with a light blocking material or surface finish to prevent light reflection and heat absorption, while the protrusions can coated or capped with a different material to prevent bonding with the substrate. Furthermore, in embodiments consistent with the present invention, the edge ring may advantageously substantially blocks light leakage from lamp radiation above a substrate to pyrometers situated below the substrate.

Substrate support rings (e.g., edge rings) in accordance with the present invention may be used to advantage in any substrate process chamber where it is desired to substantially prevent light leakage from one side of a substrate supported on the ring to an opposing side of the substrate while minimizing contact points for supporting the substrate. Examples of suitable process chambers includes any of the RADI-ANCE®, RADIANCE® PLUS, or VANTAGE® process chambers, or any other process chamber capable of performing a thermal process, for example RTP, all available from Applied Materials, Inc., of Santa Clara, Calif. The process chamber may be any chamber able to process 200 mm, 300 mm, and 450 mm substrates. Other suitable process chambers, including those available from other manufacturers may also be used and/or modified in accordance with the teachings provided herein.

FIG. 1 depicts an exemplary process chamber 100 configured to perform RTP processes and suitable for use with the inventive minimal contact edge ring in accordance with some embodiments of the present invention. In some embodiments, the process chamber 100 may be any suitable process chamber, for example, configured for thermal processing, such as a rapid thermal process (RTP).

As shown in FIG. 1 a substrate 103 is mounted inside the process chamber 100 on a substrate support 108 and is heated by the lamp head 101, which is disposed in a position opposing the substrate support 108. The lamp head 101 generates radiation which is directed to a front side 104 of the substrate 103 across processing cavity 122. Alternatively (not shown), the lamp head 101 may be configured to heat the back side 106 of the substrate 103, for example, such as by being disposed below the substrate 103, or by directing the radiation to the back side of the substrate 103. The radiation enters the process chamber 100 through a water-cooled quartz window assembly 114. Beneath the substrate 103 is a reflector plate 102, which is mounted on a water-cooled, stainless steel base 116. The base 116 includes a circulation circuit (not shown) through which coolant circulates to cool the reflector 102. In some embodiments, the reflector plate 102 is made of aluminum and has a highly reflective surface coating 120. A coolant, such as water, may be circulated through the base 116 to keep the temperature of the reflector plate 102 well below that of the heated substrate 103. Alternatively, other coolants may be provided at the same or different temperatures. For example, antifreeze (e.g., ethylene glycol, propylene glycol, or the like) or other heat transfer fluids may be circulated through the base 116. The coolant may be circulated through a chiller (not shown) coupled to the base to remove heat from the coolant. An underside, or back side, of the substrate 103 and the top of the reflector plate 102 form a reflecting cavity 118. The reflecting cavity 118 enhances the effective emissivity of the substrate 103.

The temperatures at localized regions of the substrate 103 are measured by a plurality of temperature probes, such as 152a, 152b, and 152c. Each temperature probe includes a light pipe 124 that passes through a through hole (not shown) that extends from the back side of the base 116 through the top of the reflector plate 102. The light pipe 124 is positioned within the through hole so that its uppermost end is flush with or slightly below the upper surface of the reflector plate 102. The other end of light pipe 124 is coupled to a flexible optical fiber 125 that transmits sampled light from the reflecting cavity 118 to a pyrometer 128. Each pyrometer 128 is connected to a temperature controller 150 which controls the power supplied to the lamp head 101 in response to a measured temperature. The lamps may be divided into multiple zones. The zones can be individually adjusted by the controller to allow controlled radiative heating of different areas of the substrate 103. Although three temperature probes 152a, 152b, and 152c, flexible optical fiber 125, and pyrometers 128 are shown in FIG. 1, more or less of these temperature sensing elements may be included in other embodiments.

In addition to the through hole configured to accommodate each light pipe, as described above, the base 146 and reflector plate 102 may comprise one or more additional through holes configured to accommodate other mechanisms to facilitate processing, for example, lift pins, or the like.

The substrate support 108 may be configured to be stationary or may rotate the substrate 103. The substrate support 108 includes a support or an edge ring 134 which contacts the substrate 103 at a plurality of points proximate the outer perimeter of the substrate, thereby leaving the entire underside of the substrate 103 exposed except for a small annular region near the outer perimeter.

Figure 2:
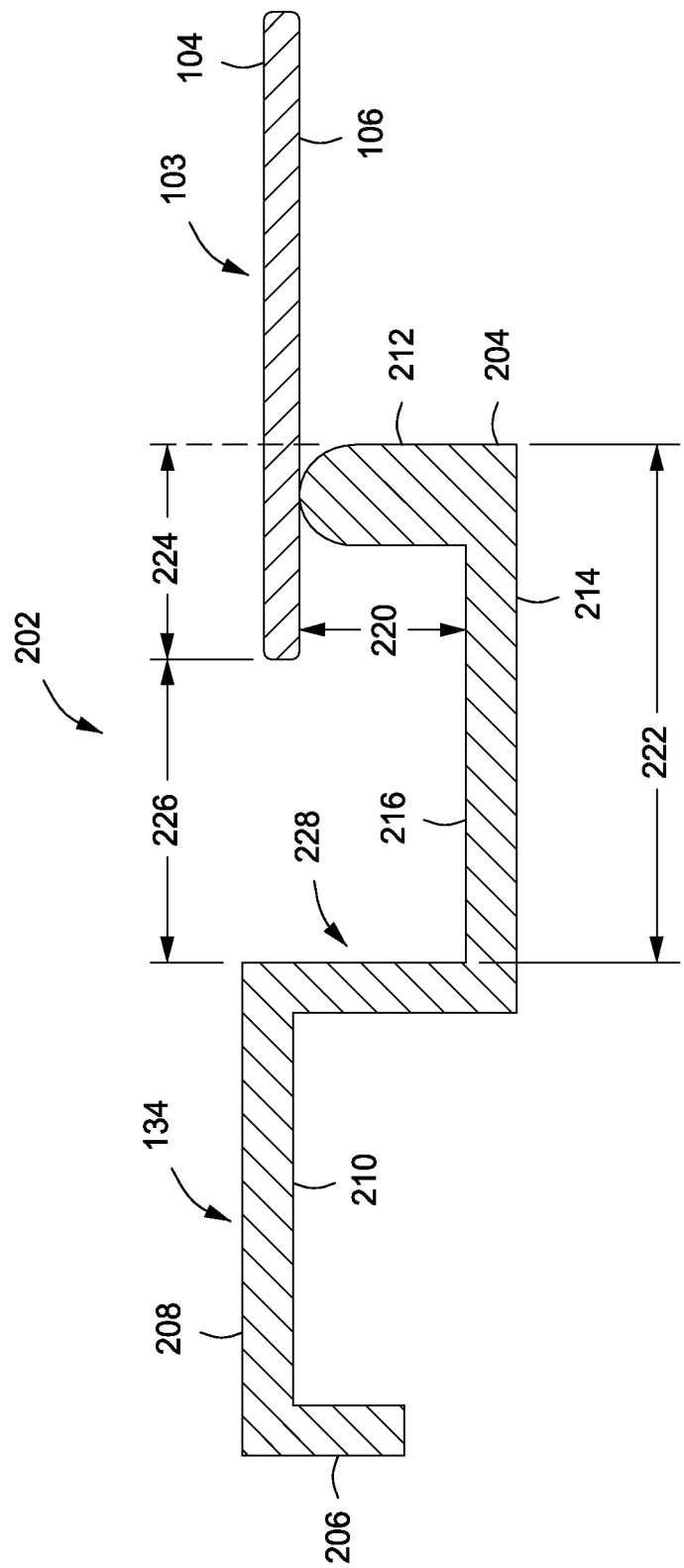
FIG. 2 depicts a partial side schematic view of an edge ring in accordance with some embodiments of the present invention.
Figure 3:
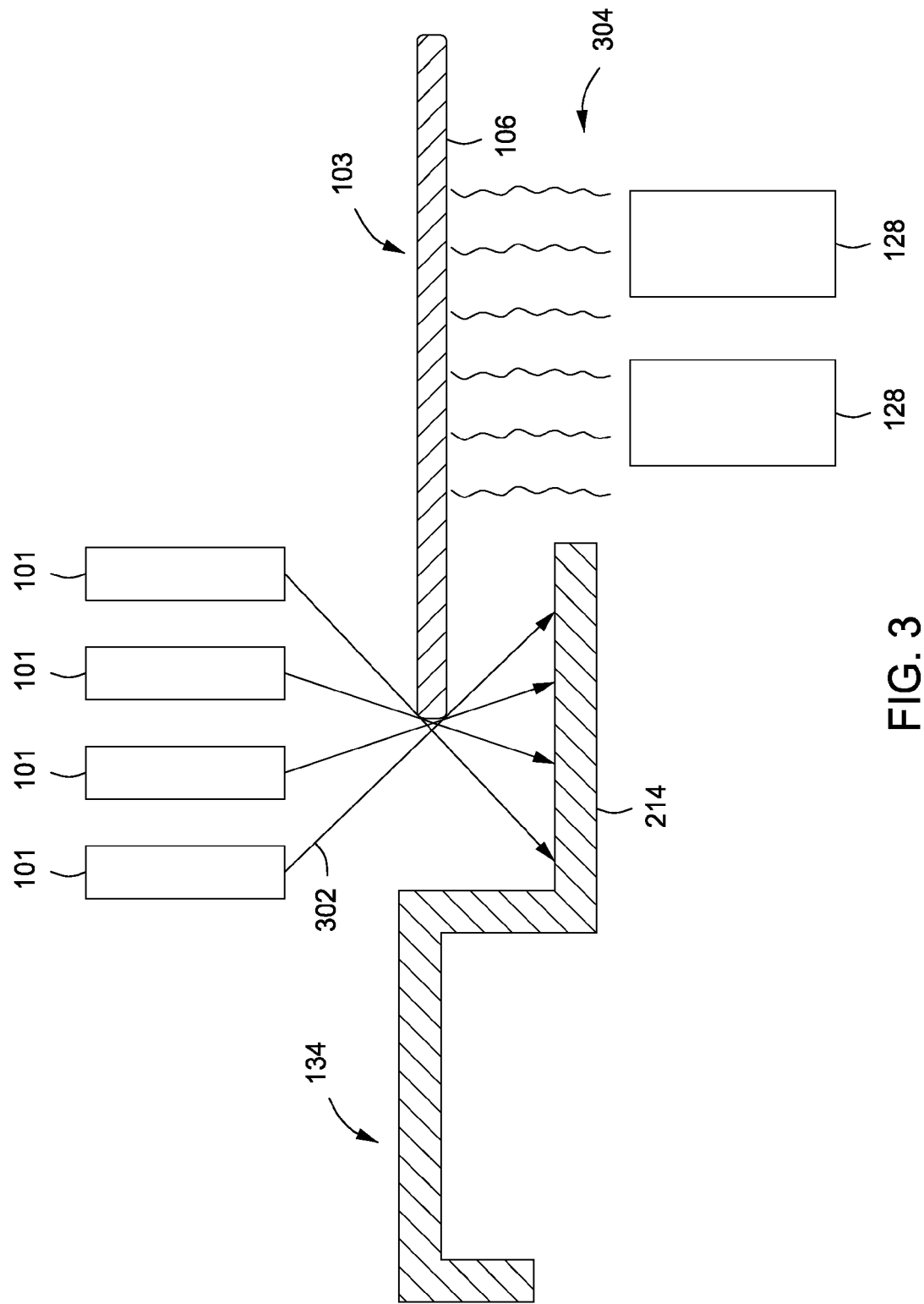
FIG. 3 depicts a partial side schematic view of an edge ring in accordance with some embodiments of the present invention.
Figure 4:
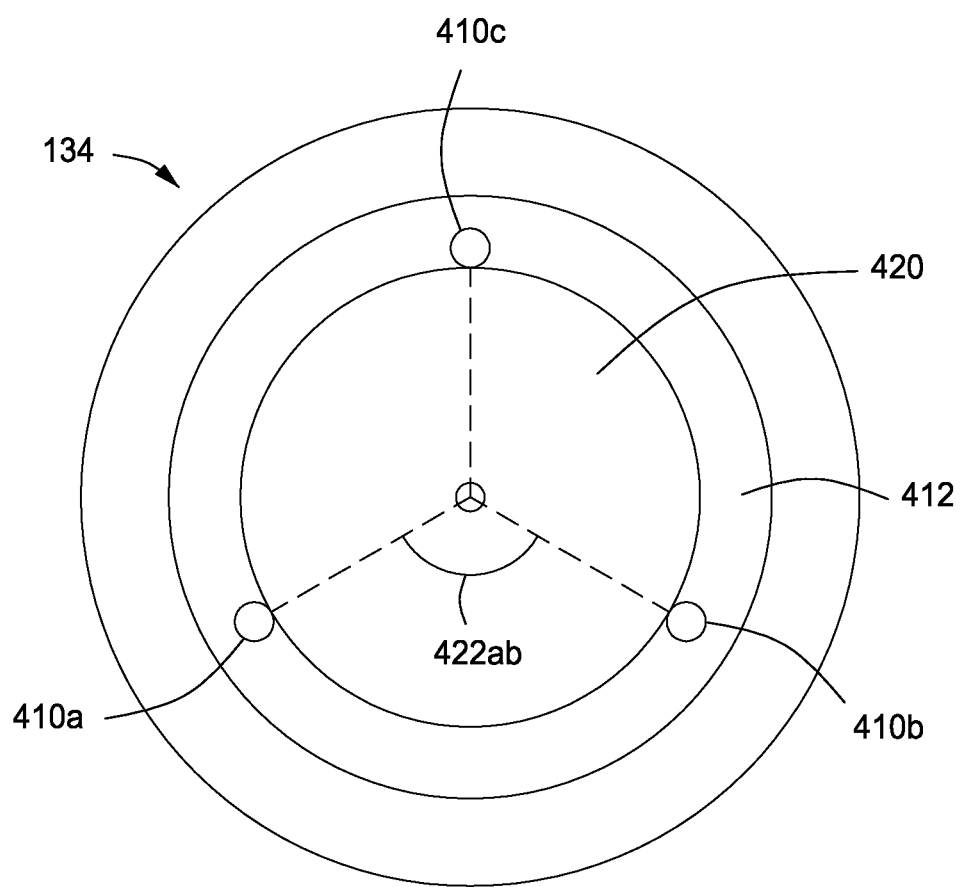
FIG. 4 depicts a top schematic view of an edge ring in accordance with some embodiments of the present invention.

The edge ring 134 is described here in detail with reference to FIGS. 2-4. The edge ring 134 includes an annular body 202 that is supported in a substantially horizontal position, for example, by rotatable tubular cylinder 136. The edge ring 134 includes an inner edge 204, an outer edge 206, an upper surface 208, and a lower surface 210. The edge ring 134 has an inner lip 214 disposed proximate the inner edge 204 and extending vertically downward from the upper surface 208.

The edge ring 134 further includes protrusions 212 extending upward from the inner lip 214 and disposed near the inner edge 204 of the annular body 202. In some embodiments, protrusions 212 are disposed along the inner edge 204 as shown in FIG. 2. The protrusions 212 are configured to support the substrate 103 along a bottom surface 106 of the substrate 103 in the process chamber 100 in a substantially horizontal position. In some embodiments, there are three protrusions 212 equidistantly spaced apart from each other (as shown in FIG. 4 and discussed in more detail below). The protrusions 212 support the substrate 103 with minimal contact area and minimal heat transfer between the edge ring and the substrate. Typically, conventional edge rings support substrates along an entire annular surface of the edge ring. Thus, conventional edge ring designs have an annular area of contact with a substrate of approximately 22.44 cm$^2$. By contrast, in some embodiments consistent with the present invention (e.g., where there are three hemispherical protrusions), the edge ring to substrate area of contact would be <1 cm$^2$. Minimizing the edge ring to substrate contact area, as done in embodiments of the present invention, reduces heat transfer by conduction and reduces the thermal gradient of the substrate 103 proximate the edge of the substrate 103 (e.g., the thermal gradient from central portions of the substrate 103 to the edge of the substrate 103).

In addition, by minimizing the contact area between the protrusions 212 and the substrate 103, the probability of substrate 103 to edge ring 134 sticking is minimized. In some embodiments, each of the protrusions 212 is coated with a material to further prevent bonding with the substrate 103, for example with an oxidized polysilicon coating. In other embodiments, each of the protrusions 212 is covered with a disposable cap comprised of a material that further prevents bonding with the substrate 103.

The protrusions 212 may extend upward from the inner lip by about 0.5 mm inches to about 5.0 mm inches (220). In some embodiments, the width of each protrusion 212 may be about 0.5 mm. The height 220 may also be determined by checking if any direct light is measured by the pyrometer when a substrate is placed on the edge ring, and/or may depend up on the inner lip 214 width. In some embodiments, the top of each protrusion 212 may be spherical/hemispherical such that contact is made between a flat substrate and the spherical protrusion 212. In some embodiments, the diameter of spherical/hemispherical protrusions 212 may be up to 3 mm. In some embodiments, the ratio of the protrusion height to the protrusion width may be determined by testing and checking the substrate wafer backside for any damage/dislocations will help to validate the optimal ratio. In other embodiments, the shape of the protrusions 212 may be any geometric shape that can stably support substrate 103 without introducing point defects, or other type of defects to substrate 103 during high temperature processing. In some embodiments, the protrusions are integrally formed with the inner lip and annular body of the edge ring. In other embodiments, the protrusions are coupled to a top surface 216 of the inner lip 214.

In some embodiments of the present invention, the width 222 of inner lip 214 of the edge ring 134 is sized to substantially block light leakage from lamphead radiation 302 to pyrometers 128 (via temperature probes 152a-c and flexible optical fibers 125) situated below the substrate. In process chambers as described herewith respect to FIG. 1, measuring an accurate emissivity of the substrate 103 is important for processing substrates. As the substrate 103 is heated by lamphead 101, it emits heat energy from the backside of the substrate. The heat energy 304 emitted may be reflected off reflector plate 120 and back again off the backside of the substrate. The pyrometers 128 measure this heat energy 304. However, direct light from lamphead 101 can cause erroneous pyrometer readings. Thus, as shown in FIG. 3, in some embodiments, the lip width of the inner lip is advantageously increased to extend further than conventional edge rings. Thus, in areas along the inner lip 214 where there are no protrusions 212, the lip width is configured to extend far enough such that it substantially prevents direct light radiation 302 from travelling from lamphead 101 disposed above the edge ring and to the pyrometers measure disposed below the edge ring. In some embodiments, the width 222 of the inner lip may be between about 15 mm and about 40 mm inches. However, the additional material due to the increased lip width does not contact the substrate, and is lower in temperature during processing (for reasons discussed below), thus minimizing or preventing any undesired heat transfer to the edge of the substrate that might undesirably increase the temperature of the substrate proximate the edge.

In some embodiments, the length of the overlap region 224 of the substrate 103 and the inner lip 214 may be about 12 mm to about 39 mm. For 200 mm substrates, the overlap region 224 may be about 12 mm to about 14 mm. For 300 mm substrates, the overlap region 224 may be about 22 mm to about 24 mm. For 450 mm substrates, the overlap region 224 may be about 37 mm to about 39 mm. In some embodiments, the length of the overlap region 224 may be sized to compensate for bowing of the substrate or in consideration of exclusion zones on the substrate. In some embodiments, the length of the edge ring from the inner edge 204 to the outer edge 206 may be about 30 mm to about 100 mm. The length of upper surface 208 may be about 25 mm to about 35 mm. The distance 226 between the outer edge of the substrate 103 and the inner edge 228 of the upper surface 208 (i.e., the horizontal distance where light may enter between the substrate and edge ring), may be about 1 mm to about 3 mm for each of 200 mm, 300 mm, and 450 mm substrates. The diameter of the central opening created by the inner edge 204 of the edge ring will depend upon the size of the substrate being processed (i.e., 200 mm, 300 mm, and 450 mm). For example, for a 200 mm substrate, the diameter of the central opening created by the inner edge 204 of the edge ring may be about 170 mm in some embodiments. The diameter of inner edge 228 to inner edge 228 may be about 202 mm to about 206 mm for edge rings configured to support 200 mm substrates, about 302 mm to 306 mm for edge rings configured to support 300 mm substrates, and about 452 mm to 456 mm for edge rings configured to support 450 mm substrates. The protrusions 212 may support the substrate 103 such that the top surface of substrate 103 and upper surface 208 are substantially planar. In other embodiments, protrusions 212 may support the substrate 103 such that the top surface of substrate 103 is disposed about 0.1 mm to about 2.0 mm below upper surface 208.

The upper surfaces of the edge ring can be coated with a light blocking material or surface finish to substantially reduce or prevent light reflection and heat absorption, while the protrusions can be coated or capped with a different material to prevent bonding with the substrate. In some embodiments, all the surfaces of the edge ring 134 (except protrusion 212) can be coated with a non-oxidized polysilicon (Poly-Si) which has low emissivity and absorptivity. In some embodiments, all the surfaces of the edge ring 134 (except protrusion 212) can be coated with a material having an emissivity between about $0.4\epsilon$ and $0.7\epsilon$. In conventional edge ring designs, if a Poly-Si coating is used, it needs to be oxidized to prevent Si—Si bonding at high temperatures which can lead to potential substrate sticking to the edge ring at high temperatures (e.g., >1000 degrees Celsius). The reduced contact area provided by the inventive edge ring 134 advantageously enables use of a non-oxidized Poly-Si coating, which in turn, reduces the temperature of the edge ring and hence radiation from the edge ring to the substrate edge during processing due to the low emissivity and absorptivity of the non-oxidized Poly-Si. In addition, in some embodiments, the surface finish of the top surface of the inner lip may be treated or conditioned (e.g., roughened) to substantially block light from being reflected from the top surface of the inner lip. In some exemplary embodiments, the top surface of the inner lip may be roughened to a surface roughness of between about 0.1 μm and 6 μm.

FIG. 4 depicts a top schematic view of the edge ring 134 in accordance with some embodiments of the present invention. In the embodiment shown in FIG. 4, the edge ring 134 includes three protrusions 410a, 410b, and 410c for supporting a substrate, an inner lip 412 and a central opening 420. Although three protrusions 410a, 410b, and 410c are shown, more protrusions can be included. In other embodiments, the protrusions may be one annular hemispherical ridge to support the substrate. The protrusions 410a-c may be spaced apart from each other at an angle 422. In some embodiments, the protrusions 410a, 410b, and 410c may be equidistantly spaced at an angle of 120° apart from each other.

Returning to FIG. 1, in some embodiments, the edge ring 134 may rest on a rotatable tubular cylinder 136 that is coated with silicon to render it opaque in the frequency range of the pyrometers 128. The coating on the cylinder 136 acts as a baffle to block out radiation from the external sources that might contaminate the intensity measurements. The bottom of the cylinder 136 is held by an annular upper bearing 141 which rests on a plurality of ball bearings 137 that are, in turn, held within a stationary, annular, lower bearing race 139. In some embodiments, the ball bearings 137 are made of steel and coated with silicon nitride to reduce particulate formation during operations. The upper bearing 141 is magnetically coupled to an actuator (not shown) which rotates the cylinder 136, the edge ring 134 and the substrate 103 during the thermal processing.

A purge ring 145, which is fitted into the chamber body, surrounds the cylinder 136. In some embodiments, the purge ring 145 has an internal annular cavity 147 which opens up to a region above the upper bearing 141. The internal cavity 147 is connected to a gas supply (not shown) through a passageway 149. During processing, a purge gas is flowed into the chamber through the purge ring 145.

In some embodiments, the edge ring 134 has an outer radius that is larger than the radius of the cylinder 136 so that it extends out beyond the cylinder 136. The annular extension of the edge ring 134 beyond the cylinder 136, in cooperation with the purge ring 145 located below it, functions as a baffle which prevents stray light from entering the reflecting cavity 118 at the back side of the substrate 103. To further reduce the possibility of stray light entering into the reflecting cavity 118, the edge ring 134 and the purge ring 145 may also be coated with a material (for example, a black or gray material) that absorbs the radiation generated by the lamp head 101.

The substrate support 108 may be coupled to a lift mechanism 155 capable of raising and lowering the substrate with respect to the lamp head 101. For example, the substrate support 108 may be coupled to the lift mechanism 155, such that a distance between the substrate 103 and the reflector 102 is constant during the lifting motion.

In some embodiments, the substrate support 108 can be adapted to magnetically levitate and rotate within the process chamber 100 (not shown). The substrate support 108 is capable of rotating while raising and lowering vertically during processing, and may also be raised or lowered without rotation before, during, or after processing. This magnetic levitation and/or magnetic rotation prevents or minimizes particle generation due to the absence or reduction of moving parts typically required to raise/lower and/or rotate the substrate support.

While the foregoing is directed to embodiments of the present invention, other and further embodiments of the invention may be devised without departing from the basic scope thereof.

The invention claimed is:

1. An edge ring for a substrate process chamber, comprising:
an annular body having a central opening, an inner edge, an outer edge, an upper surface, and a lower surface;
an inner lip disposed proximate the inner edge and extending downward from the upper surface; and
a plurality of protrusions extending upward from the inner lip and disposed along the inner edge of the annular body, wherein the plurality of protrusions are arranged to support a substrate above the inner lip and over the central opening,
wherein the inner lip is configured to substantially prevent light radiation from travelling between a first volume disposed above the edge ring and a second volume disposed below the edge ring when a substrate is disposed on the plurality of protrusions, and wherein a top surface of the inner lip is conditioned to substantially block light from being reflected from the top surface of the inner lip.

2. The edge ring of claim 1, wherein a width of the inner lip is selected to substantially prevent light radiation from travelling between a first volume disposed above the edge ring and a second volume disposed below the edge ring.

3. An edge ring for a substrate process chamber, comprising:
an annular body having a central opening, an inner edge, an outer edge, an upper surface, and a lower surface;
an inner lip disposed proximate the inner edge and extending downward from the upper surface; and
a plurality of protrusions extending upward from the inner lip and disposed along the inner edge of the annular body, wherein the plurality of protrusions are arranged to support a substrate above the inner lip and over the central opening,
wherein the inner lip is configured to substantially prevent light radiation from travelling between a first volume disposed above the edge ring and a second volume disposed below the edge ring when a substrate is disposed on the plurality of protrusions, wherein the plurality of protrusions are configured to support a substrate proximate a peripheral edge of the substrate when disposed in the process chamber, and wherein a width of the inner lip is between 15 mm and about 40 mm inches.

4. The edge ring of claim 1, wherein the plurality of protrusions are configured to support a substrate proximate a peripheral edge of the substrate when disposed in the process chamber.

5. The edge ring of claim 4, wherein each of the plurality of protrusions is coated with a material to substantially prevent bonding with the substrate.

6. The edge ring of claim 4, wherein a total contact area between all of the plurality of protrusions and the substrate is less than 1 cm$^2$.

7. An edge ring for a substrate process chamber, comprising:
an annular body having a central opening, an inner edge, an outer edge, an upper surface, and a lower surface;
an inner lip disposed proximate the inner edge and extending downward from the upper surface; and
a plurality of protrusions extending upward from the inner lip and disposed along the inner edge of the annular body, wherein the plurality of protrusions are arranged to support a substrate above the inner lip and over the central opening,
wherein the inner lip is configured to substantially prevent light radiation from travelling between a first volume disposed above the edge ring and a second volume disposed below the edge ring when a substrate is disposed on the plurality of protrusions, wherein the plurality of protrusions are configured to support a substrate proximate a peripheral edge of the substrate when disposed in the process chamber, and wherein each of the plurality of protrusions is covered with a disposable cap comprised of a material that substantially prevents bonding with the substrate.

8. The edge ring of claim 1, wherein each of the plurality of protrusions extends upward from the inner lip by about 0.5 mm to about 5.0 mm.

9. The edge ring of claim 1, wherein the annular body and inner lip of the edge ring are coated with a material with an emissivity between about $0.4\epsilon$ and $0.7\epsilon$.

10. The edge ring of claim 1, wherein the annular body and inner lip of the edge ring are coated with a non-oxidized polysilicon material, and wherein each of the plurality of protrusions are coated with an oxidized poly-silicon coating.

11. The edge ring of claim 1, wherein the plurality of protrusions are three protrusions equidistantly spaced apart from each other.

12. The edge ring of claim 1, wherein the plurality of protrusions are hemispherically shaped.

13. The edge ring of claim 1, wherein the plurality of protrusions are integrally formed with the inner lip and annular body of the edge ring.

14. The edge ring of claim 1, wherein the plurality of protrusions are coupled to a top surface of the inner lip.

15. An apparatus for processing a substrate, comprising:
a processing chamber having a substrate support comprising the edge ring according to claim 1 to support the substrate proximate a peripheral edge of the substrate, a base disposed below the edge ring, and one or more members extending from the base to support the edge ring above the base;

a lamphead disposed above the substrate support to provide energy to a top surface of a substrate when disposed on the substrate support; and at least one temperature sensor opposing the lamphead and disposed below the edge ring to measure heat energy radiated from a backside of the substrate when disposed on the substrate support.

16. The apparatus of claim 15, wherein the lamphead provides light energy that transmits heat a substrate when disposed on the substrate support and wherein the at least one temperature sensor is configured to measure a heat energy emitted from a backside of the substrate.

17. The apparatus of claim 15, wherein a width of the inner lip is selected to substantially prevent light radiation from the lamphead from reaching the at least one temperature sensor.

18. The apparatus of claim 15, wherein the plurality of protrusions are configured to support the substrate with minimal contact area and minimal heat transfer between the edge ring and the substrate.

19. The apparatus of claim 15 wherein the annular body and inner lip of the edge ring are coated with a material with low emissivity between about $0.4\epsilon$ and $0.7\epsilon$, and wherein each of the plurality of protrusions are coated with a material to substantially prevent bonding with the substrate.

* * * * *